United States Patent
Wang et al.

(10) Patent No.: US 11,973,511 B2
(45) Date of Patent: Apr. 30, 2024

(54) ANALOG-TO-DIGITAL CONVERTING DEVICE AND METHOD OF OFFSET CALIBRATION

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Ting-Hao Wang, Hsinchu (TW); Hsin-Han Han, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 156 days.

(21) Appl. No.: 17/817,636

(22) Filed: Aug. 4, 2022

(65) Prior Publication Data
US 2023/0318612 A1    Oct. 5, 2023

(30) Foreign Application Priority Data

Mar. 31, 2022    (TW) .................................. 111112652

(51) Int. Cl.
 *H03M 1/10*    (2006.01)
 *H03M 1/06*    (2006.01)
 *H03M 1/12*    (2006.01)

(52) U.S. Cl.
 CPC ....... *H03M 1/1023* (2013.01); *H03M 1/0636* (2013.01); *H03M 1/1215* (2013.01); *H03M 1/126* (2013.01)

(58) Field of Classification Search
 CPC .. H03M 1/1023; H03M 1/0636; H03M 1/126; H03M 1/1215
 USPC .......................................... 341/118, 120, 155
 See application file for complete search history.

(56) References Cited

U.S. PATENT DOCUMENTS 9,608,652 B2 *    3/2017    Lee ..................... H03M 1/0836
10,833,693 B2 *    11/2020    Björk .................. H03M 1/1004

FOREIGN PATENT DOCUMENTS

EP            1401105 A1 *    3/2004    ............ H03M 3/384

\* cited by examiner

*Primary Examiner* — Khai M Nguyen
(74) *Attorney, Agent, or Firm* — CKC & Partners Co., LLC (57) ABSTRACT

An analog-to-digital converting device includes N-stage first analog-to-digital converters (ADCs), a second ADC, a first calibration circuit, a data recovery circuit and an output circuit. The N-stage first ADCs has a first sampling frequency that is (N+1)/N times of a second sampling frequency, and converts an input signal into first quantized outputs. The second ADC has the second sampling frequency, and converts the input signal into a second quantized output. The first calibration circuit calibrates offsets of the first quantized outputs and the second quantized output to generate third quantized outputs and a fourth quantized output. The data recovery circuit outputs, by the second sampling frequency, one of the third quantized outputs as a fifth quantized output, and subtracts the fifth quantized output from the fourth quantized output to generate output data. The output circuit generates an output signal according to the third quantized outputs and the output data.

18 Claims, 7 Drawing Sheets

ANALOG-TO-DIGITAL CONVERTING DEVICE AND METHOD OF OFFSET CALIBRATION

RELATED APPLICATIONS

This application claims priority to Taiwan Application Serial Number 111112652, filed on Mar. 31, 2022, which is herein incorporated by reference in its entirety.

BACKGROUND

Technical Field

The present disclosure relates to an analog-to-digital conversion technology. More particularly, the present disclosure relates to an analog-to-digital converting device and a method of offset calibration that can prevent the loss of sampling result.

Description of Related Art

Analog-to-digital converters (ADCs) are widely used in communication systems, electronic instruments, and various computer systems. Due to process variation, the output signal of the ADC may contain offset errors. For example, a signal of 0 V is inputted to the ADC, but the output signal of the ADC corresponds to a voltage other than 0 V. In different ADCs, the degree of offset may vary due to usage conditions or random variations of components, and it is difficult to uniformly calibrate at the factory, so the ADCs usually have an automatic offset calibration function. However, when the signals inputted to the ADC has certain frequencies, the automatic offset calibration function of the ADC may erroneously cancel the sampling results of the ADC.

SUMMARY

The disclosure provides an analog-to-digital converting device including N-stage first analog-to-digital converters (ADCs), a second ADC, a first calibration circuit, a data recovery circuit and an output circuit. The N-stage first ADCs have a first sampling frequency, and are configured to convert, by a time-interleaved manner, an input signal into a plurality of stages of first quantized output. N is a positive integer larger than or equal to 2. The second ADC has a second sampling frequency, and is configured to convert the input signal into a second quantized output. The first sampling frequency is $(N+1)/N$ times of the second sampling frequency. The first calibration circuit is configured to calibrate offsets of the plurality of stages of first quantized output and the second quantized output, so as to respectively generate a plurality of stages of third quantized output and a fourth quantized output. The data recovery circuit is coupled with the first calibration circuit. The data recovery circuit is configured to output, by the second sampling frequency, one of the plurality of stages of third quantized output as a fifth quantized output, and configured to subtract the fifth quantized output from the fourth quantized output to generate a plurality of output data. The output circuit is configured to generate an output signal according to the plurality of stages of third quantized output and the plurality of output data.

The disclosure provides a method of offset calibration applicable to an analog-to-digital converting device. The analog-to-digital converting device includes N-stage first ADCs and a second ADC. The method includes the following operations: by a time-interleaved manner, utilizing the N-stage first ADCs to convert an input signal into a plurality of stages of first quantized output, according to a first sampling frequency, in which N is a positive integer larger than or equal to 2; utilizing the second ADC to convert the input signal into a second quantized output, according to a second sampling frequency, wherein the first sampling frequency is $(N+1)/N$ times of the second sampling frequency; calibrating offsets of the plurality of stages of first quantized output and the second quantized output, so as to respectively generate a plurality of stages of third quantized output and a fourth quantized output; outputting, by the second sampling frequency, one of the plurality of stages of third quantized output as a fifth quantized output; subtracting the fifth quantized output from the fourth quantized output to generate a plurality of output data; and generating an output signal according to the plurality of stages of third quantized output and the plurality of output data.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
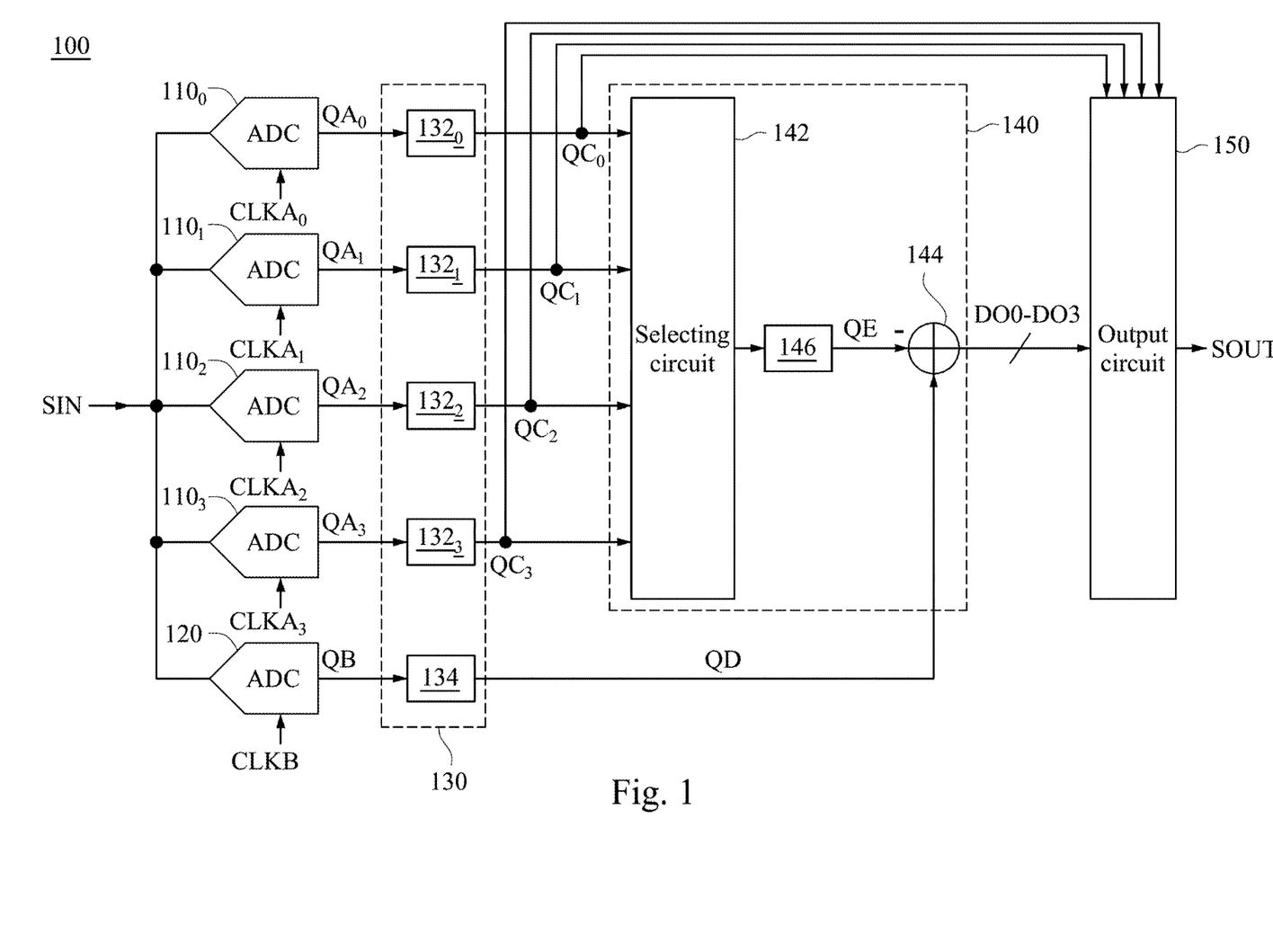
FIG. 1 is a simplified functional block diagram of an analog-to-digital converting device according to an embodiment of the present disclosure.
Figure 2:
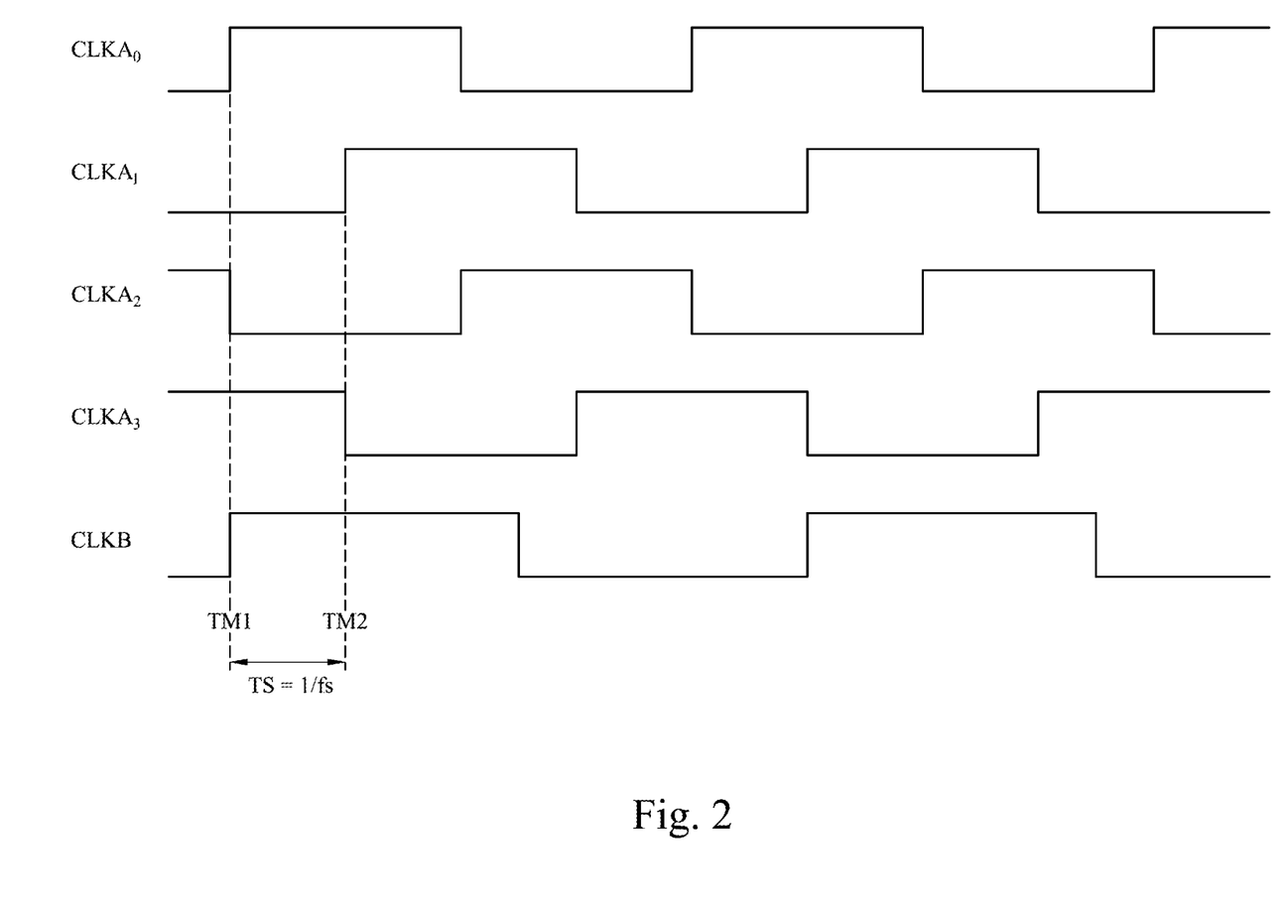
FIG. 2 is a waveform schematic diagram of a plurality of clock signals of FIG. 1, according to some embodiments of the present disclosure.

FIG. 1 is a simplified functional block diagram of an analog-to-digital converting device 100 according to an embodiment of the present disclosure. FIG. 2 is a waveform schematic diagram of a plurality of clock signals of FIG. 1, according to some embodiments of the present disclosure. Reference is made to FIG. 1 and FIG. 2, where the analog-to-digital converting device 100 includes a plurality of stages of first analog-to-digital converter (ADC) $110_0$-$110_3$, a second ADC 120, a first calibration circuit 130, a data recovery circuit 140 and an output circuit 150. The first ADCs $110_0$-$110_3$ are configured to sample an input signal SIN respectively according to a plurality of first clock signals $CLKA_0$-$CLKA_3$, so as to respectively generate a plurality of stages of first quantized output $QA_0$-$QA_3$. In some embodiments, the analog-to-digital converting device 100 may further comprise a time-skew calibration circuit and/or gain calibration circuit, where these circuits are omitted from FIG. 1 for the sake of brevity.

As shown in FIG. 2, the first clock signals $CLKA_0$-$CLKA_3$ are time-interleaved signals. A time interval exists between two adjacent first clock signals of the first clock signals $CLKA_0$-$CLKA_3$, so that the first ADCs $110_0$-$110_3$ sample the input signal SIN and perform the analog-to-digital conversion in different times. For example, according to the first clock signal $CLKA_0$, the first ADC $110_0$ may sample at a sampling time TM1. According to the first clock signal $CLKA_1$, the first ADC $110_1$ may sample at a sampling time TM2. The first ADCs $110_0$-$110_3$ are configured to sample the input signal SIN by a time-interleaved manner, so that the analog-to-digital converting device 100 is operated as a time-interleaved analog-to-digital converting device in an embodiment. In an embodiment, a difference between the sampling time TM1 and the sampling time TM2 is a system sampling period TS of the analog-to-digital converting device 100, and a reciprocal of the system sampling period TS is a system sampling frequency fs of the analog-to-digital converting device 100, that is, TS=1/fs.

The second ADC 120 is configured to sample the input signal SIN according to the second clock signal CLKB to generate the second quantized output QB. Frequencies of the first clock signals $CLKA_0$-$CLKA_3$ are higher than a frequency of the second clock signal CLKB, so that a first sampling frequency of the first ADCs $110_0$-$110_3$ is higher than a second sampling frequency of the second ADC 120. The second ADC 120 is help to increase the accuracy of the sampling results of the first ADCs $110_0$-$110_3$, which will be further described in the following.

In the embodiments of the following paragraphs, the first sampling frequency (or the frequency of the first clock signals $CLKA_0$-$CLKA_3$) is assumed to be 500 MHz, and the second sampling frequency (or the frequency of the second clock signal CLKB) is assumed to be 400 MHz, for the convenience of explanation. However, the number of the first ADCs $110_0$-$110_3$, the first sampling frequency (or the frequency of the first clock signals $CLKA_0$-$CLKA_3$) and the second sampling frequency (or the frequency of the second clock signal CLKB) are not limited to the exemplary embodiments in the aforesaid and following paragraphs. In some embodiments, when the analog-to-digital converting device 100 includes N-stage first ADCs, the first sampling frequency (or the frequency of the first clock signals $CLKA_0$-$CLKA_3$) is (N+1)/N times of the second sampling frequency (or the frequency of the second clock signal CLKB), wherein N is a positive integer larger than or equal to 2. In other words, the first sampling frequency is fs/N, and the second sampling frequency is fs/(N+1).

The first calibration circuit 130 is coupled with the first ADCs $110_0$-$110_3$, the second ADC 120, the data recovery circuit 140 and the output circuit 150. The first calibration circuit 130 is configured to calibrate offsets of the first quantized outputs $QA_0$-$QA_3$ to generate a plurality of stages of third quantized output $QC_0$-$QC_3$, and configured to calibrate an offset of the second quantized output QB to generate a fourth quantized output QD. The third quantized outputs $QC_0$-$QC_3$ are transmitted to the data recovery circuit 140 and the output circuit 150. The fourth quantized output QD is transmitted to the data recovery circuit 140.

Specifically, the first calibration circuit 130 includes a plurality of first sub-calibration circuits $132_0$-$132_3$ and a second sub-calibration circuit 134, in which the first sub-calibration circuits $132_0$-$132_3$ are coupled with the first ADCs $110_0$-$110_3$, respectively, and the second sub-calibration circuit 134 is coupled with the second ADC 120. The first sub-calibration circuits $132_0$-$132_3$ have similar operations, and thus only the first sub-calibration circuit $132_0$ is discussed in the following examples, for the sake of brevity. The first sub-calibration circuit $132_0$ is configured to average the first quantized output $QA_0$ to obtain an offset calibration value of the first quantized output $QA_0$. Then, the first sub-calibration circuit $132_0$ subtracts the offset calibration value of the first quantized output $QA_0$ from the first quantized output $QA_0$ to generate the third quantized output $QC_0$. In addition, the second sub-calibration circuit 134 is configured to average the second quantized output QB to generate an offset calibration value of the second quantized output QB. Then, the second sub-calibration circuit 134 subtracts the offset calibration value of the second quantized output QB from the second quantized output QB to generate a fourth quantized output QD.

Figure 3:
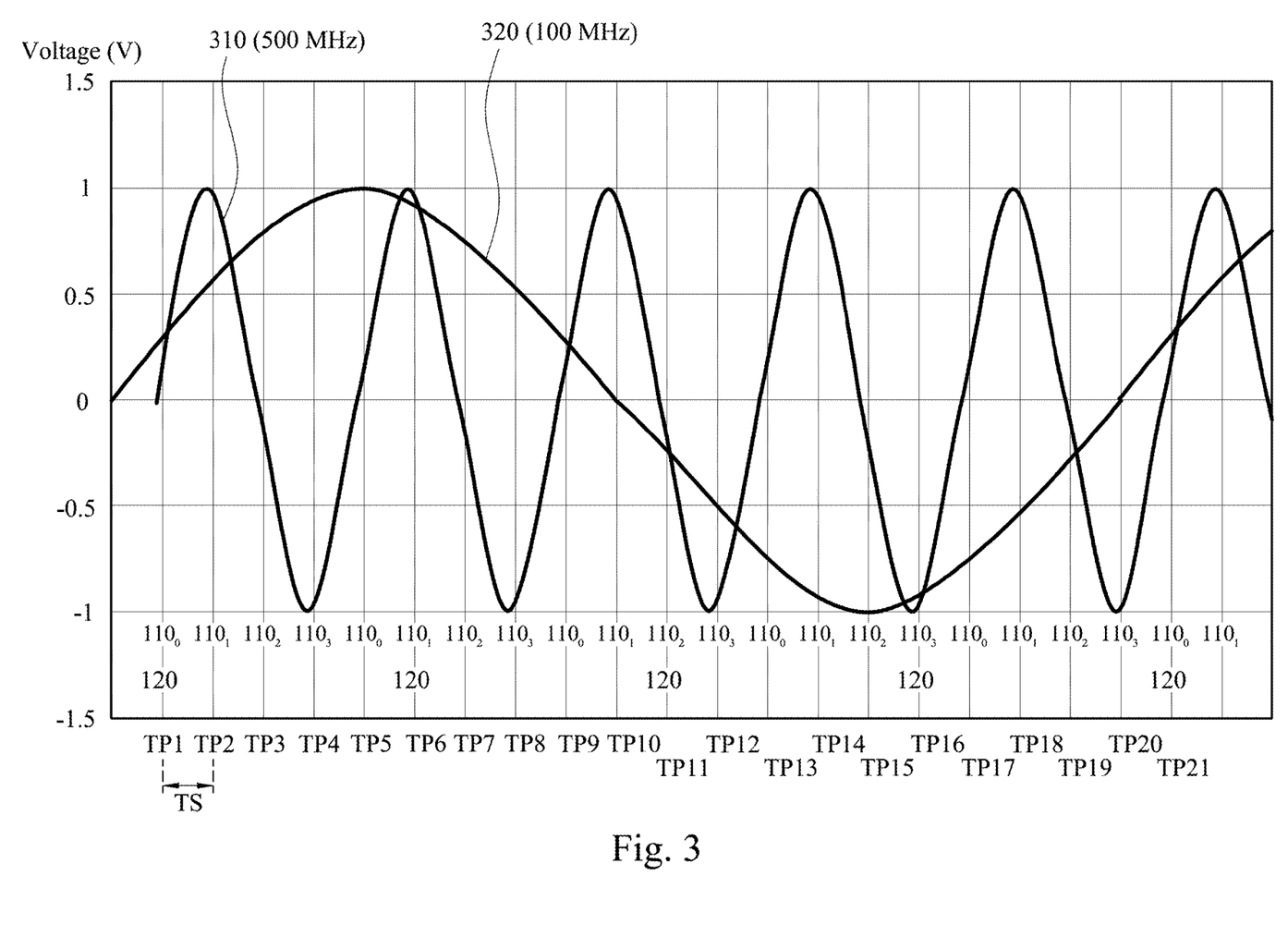
FIG. 3 is a schematic diagram of signal components of an input signal according to an embodiment of the present disclosure.

In some situations, the first calibration circuit 130 may erroneously calibrate the first quantized outputs $QA_0$-$QA_3$. Reference is made to FIG. 3, in which FIG. 3 is a schematic diagram of signal components of the input signal SIN according to an embodiment of the present disclosure. The input signal SIN includes a target signal 310 with a frequency of 500 MHz. In ideal, the analog-to-digital converting device 100 is configured to generate a digital output signal SOUT according to the target signal 310. In FIG. 3, the interval between two adjacent sampling times of the sampling times TP1-TP21 is the system sampling period TS.

When the frequency of the target signal 310 is the same as the first sampling frequency of the first ADCs $110_0$-$110_3$ (e.g., both are 500 MHz), or the frequency of the target signal 310 is a positive integer multiple of the first sampling frequency (e.g., when the first ADCs are N-stage, the frequency of the target signal 310 is fs×i/N and i is a positive integer), each of the first ADCs $110_0$-$110_3$ successively obtains the same value when sampling the target signal 310. In this situation, since the first calibration circuit 130 obtains the offset calibration value through the average operation, each offset calibration value is the same as the first quantized output corresponding thereto, instead of the real offset calibration value, so that the first calibration circuit 130 erroneously calibrates the first quantized outputs $QA_0$-$QA_3$.

For example, as shown in FIG. 3, when each time the first ADC $110_0$ samples the target signal 310, the target signal 310 is approximately 0.1 V, so that the first quantized output $QA_0$ remains corresponding to 0.1 V. As such, the offset calibration value of the first quantized output $QA_0$ calculated by the first calibration circuit 130 corresponds to 0.1 V, so that the third quantized output $QC_0$ (i.e., the calibrated first quantized output $QA_0$) corresponds to 0 V.

As another example, when each time the first ADC $110_1$ samples, the target signal 310 is approximately 0.9 V, so that the first quantized output $QA_1$ remains corresponding to 0.9 V. As such, the offset calibration value of the first quantized output $QA_1$ calculated by the first calibration circuit 130 corresponds to 0.9 V, so that the third quantized output $QC_1$ (i.e., the calibrated first quantized output $QA_1$) corresponds to 0 V.

The data recovery circuit 140 may utilize the fourth quantized output QD of the second ADC 120 to recover (or as) the erroneously calibrated first quantized outputs $QA_0$-$QA_3$ to generate output data $DO_0$-$DO_3$. The output circuit 150 is configured to generate the digital output signal SOUT according to the third quantized outputs $QC_0$-$QC_3$ and the output data DO0-DO3. In an embodiment, the output circuit 150 is configured to add the third quantized outputs $QC_0$-$QC_3$ to the output data DO0-DO3, respectively. For example, a combination of the third quantized output $QC_0$ and the output data DO0 corresponds to the sampling result of the first ADC $110_0$; a combination of the third quantized output $QC_1$ and the output data DO1 corresponds to the sampling result of the first ADC $110_1$, and so forth. The output circuit 150 may proceed to data combination operation to generate the output signal SOUT with the system sampling frequency fs. In some embodiments, the output circuit 150 may be realized by a multiplexer, but this disclosure is not limited thereto.

The principle of recovering the first quantized outputs $QA_0$-$QA_3$ by the fourth quantized output QD is explained in the following paragraphs. By setting the first sampling frequency to (N+1)/N times of the second sampling frequency of the second ADC 120, the first ADCs $110_0$-$110_3$ sequentially sample with the second ADC 120 at substantially the same time, so that the second ADC 120 obtains the sampling results of the first ADCs $110_0$-$110_3$. For example, as shown in FIG. 3, the first ADC $110_0$ and the second ADC 120 simultaneously sample the target signal 310 of 0.1 V at the sampling time TP1, and therefore the fourth quantized output QD of the sampling time TP1 can be used to recover (or as) the first quantized output $QA_0$ of the sampling time TP1; the first ADC $110_1$ and the second ADC 120 simultaneously sample the target signal 310 of 0.9 V at the sampling time TP6, and therefore the fourth quantized output QD of the sampling time TP6 can be used to recover (or as) the first quantized output $QA_1$ of the sampling time TP6, and so forth. In some embodiments that the first ADCs are N-stage, in two successive samplings of the second ADC 120, the second ADC 120 samples substantially together with a (K−1)-th stage first ADC of the N stages first ADCs, and then the second ADC 120 samples substantially together with a K-th stage first ADC, in which K is a positive integer smaller than or equal to N.

In some embodiments, the input signal SIN further includes other crosstalk signals (e.g., crosstalk signal 320) with frequencies different from that of the target signal 310. In general, the crosstalk signals are alternating current (AC) signals, and therefore the effects caused by the crosstalk signals to the fourth quantized output QD can be canceled by coupling the average filters in series, such as first average filters $530_0$-$530_3$ and second average filters $540_0$-$540_3$ of FIG. 5. For example, the fourth quantized output QD of the sampling time TP1 may be processed by the average filter, and then be used to recover the first quantized output $QA_0$. As another example, the fourth quantized output QD of the sampling time TP6 may be processed by another average filter, and then be used to recover the first quantized output $QA_1$. However, when the frequency of the crosstalk signal 320 is 100 MHz (i.e., when the first ADCs are N-stage and the frequency of the crosstalk signal 320 is fs×j/[N×(N+1)], in which j is a positive integer), the effects caused by the crosstalk signal 320 to the fourth quantized output QD to a certain extent is similar to the effects caused by the direct current (DC) signal. As a result, the components of the crosstalk signal 320 cannot be canceled from the fourth quantized output QD by the average filter.

For example, as shown in FIG. 3, when the second ADC 120 samples at the sampling time TP1 and the sampling time TP21 to recover the first quantized output $QA_0$, the crosstalk signal 320 is 0.3 V. Therefore, even though the two fourth quantized outputs QD are averaged, the components of the crosstalk signal 320 still completely remain, instead of being cancelled.

The data recovery circuit 140 can be used to solve the above problem. The data recovery circuit 140 includes a selecting circuit 142 and a processing circuit 144. The data recovery circuit 140 is configured to (e.g., by the selecting circuit 142) output, by the second sampling frequency, a corresponding one of the third quantized outputs $QC_0$-$QC_3$ as the fifth quantized output QE. Therefore, the fifth quantized output QE can be understood as a quantized output obtained by sampling the input signal SIN by the second sampling frequency, and includes the components related to the crosstalk signal 320 (e.g., 100 MHz) but does not include the components related to the target signal 310 (e.g., 500 MHz), which is because the components related to the target signal 310 have been canceled by the first calibration circuit 130. The data recovery circuit 140 is further configured to subtract the fifth quantized output QE from the fourth quantized output QD to remove the components related to the crosstalk signal 320 (e.g., 100 MHz) from the fourth quantized output QD and to preserve the components related to the target signal 310 (e.g., 500 MHz), so as to generate the output data DO0-DO3. In some embodiments, the output data DO0-DO3 respectively correspond to sampling results of the four channels realized by the first ADCs $110_0$-$110_3$ to the target signal 310 (e.g., 500 MHz).

Figure 4:
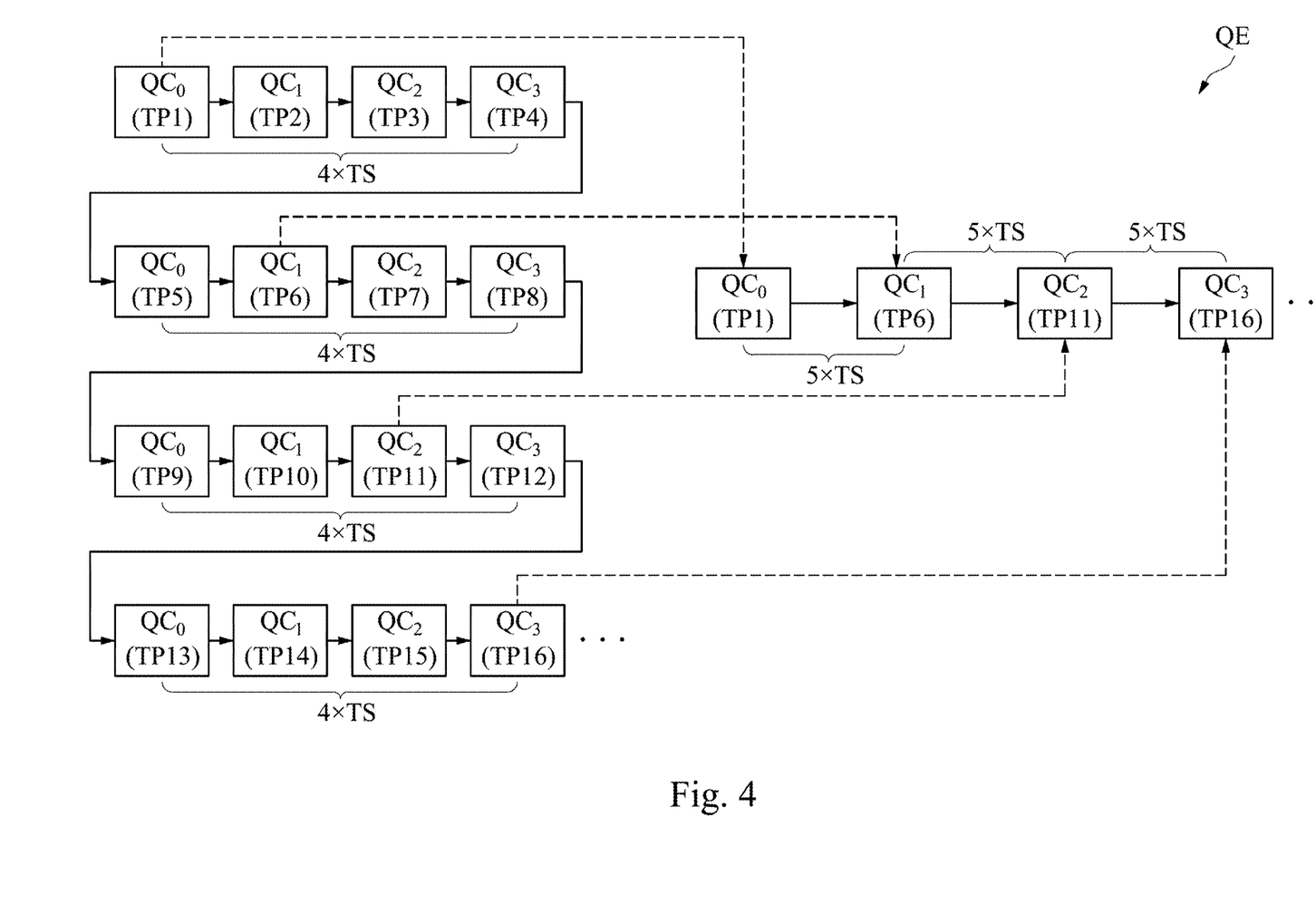
FIG. 4 is a schematic diagram of the operation of a selecting circuit according to an embodiment of the present disclosure.

Operations of the selecting circuit 142 and the processing circuit 144 will be further described in the following with reference to FIG. 4 and FIG. 5. Reference is made to FIG. 4, in which FIG. 4 is a schematic diagram of the operation of the selecting circuit 142 according to an embodiment of the present disclosure. As aforementioned, the interval between two adjacent sampling times of the sampling times TP1-TP21 is the system sampling period TS. The selecting circuit 142 is configured to receive the third quantized outputs $QC_0$-$QC_3$, and output one of the third quantized outputs $QC_0$-$QC_3$ as the fifth quantized output QE every four system sampling periods TS (i.e., when the first ADCs are N-stage, every N system sampling periods TS). As shown in FIG. 4, the selecting circuit 142 sequentially outputs the third quantized output $QC_0$ of the sampling time TP1, the third quantized output $QC_1$ of the sampling time TP6, the third quantized output $QC_2$ of the sampling time TP11 and the third quantized output $QC_3$ of the sampling time TP16.

In other words, the sampling time of the third quantized output currently outputted by the selecting circuit 142 is spaced from that of the third quantized output previously outputted by the selecting circuit 142 by five system sampling periods TS (i.e., when the first ADCs are N-stage, spaced by N+1 system sampling periods TS). For example, as shown in FIG. 4, among the third quantized outputs forming the fifth quantized output QE, the third quantized output $QC_1$ (sampling time TP6) and the previous third quantized output $QC_0$ (sampling time TP1) are spaced by five system sampling periods TS.

In one embodiment, the selecting circuit 142 may include latch circuits or a random access memory to store the four third quantized outputs $QC_0$-$QC_3$ of every four system sampling periods TS. The selecting circuit 142 may include a multiplexer configured to output a corresponding one of the four third quantized outputs $QC_0$-$QC_3$.

Reference is made again to FIG. 1, in which the data recovery circuit 140 further includes a second calibration circuit 146 in some embodiments. The second calibration circuit 146 is coupled with the selecting circuit 142, and is configured to calibrate an offset of the third quantized output outputted by the selecting circuit 142 to generate the fifth quantized output QE. The principle of the calibration operation of the second calibration circuit 146 is similar to those of the first sub-calibration circuits $132_0$-$132_3$ or the second sub-calibration circuit 134 described above, and therefore a detailed description is omitted here for the sake of brevity.

In some embodiments, the input signal SIN includes a crosstalk signal with the second sampling frequency (e.g., a crosstalk signal of 400 MHz, not shown in FIG. 3). As can be known from FIG. 4, the output of the selecting circuit 142 can be understood as a quantized output obtained by sampling the input signal SIN by the second sampling frequency, rendering the crosstalk signal with the second sampling frequency cause DC components with fixed values in the output of the selecting circuit 142. Therefore, the second calibration circuit 146 can remove, through the average operation, the components related to the crosstalk signal with the second sampling frequency from the output of the selecting circuit 142. In some embodiments, in the case that the input signal SIN does not include the crosstalk signal with the second sampling frequency, the second calibration circuit 146 can be omitted.

Figure 5:
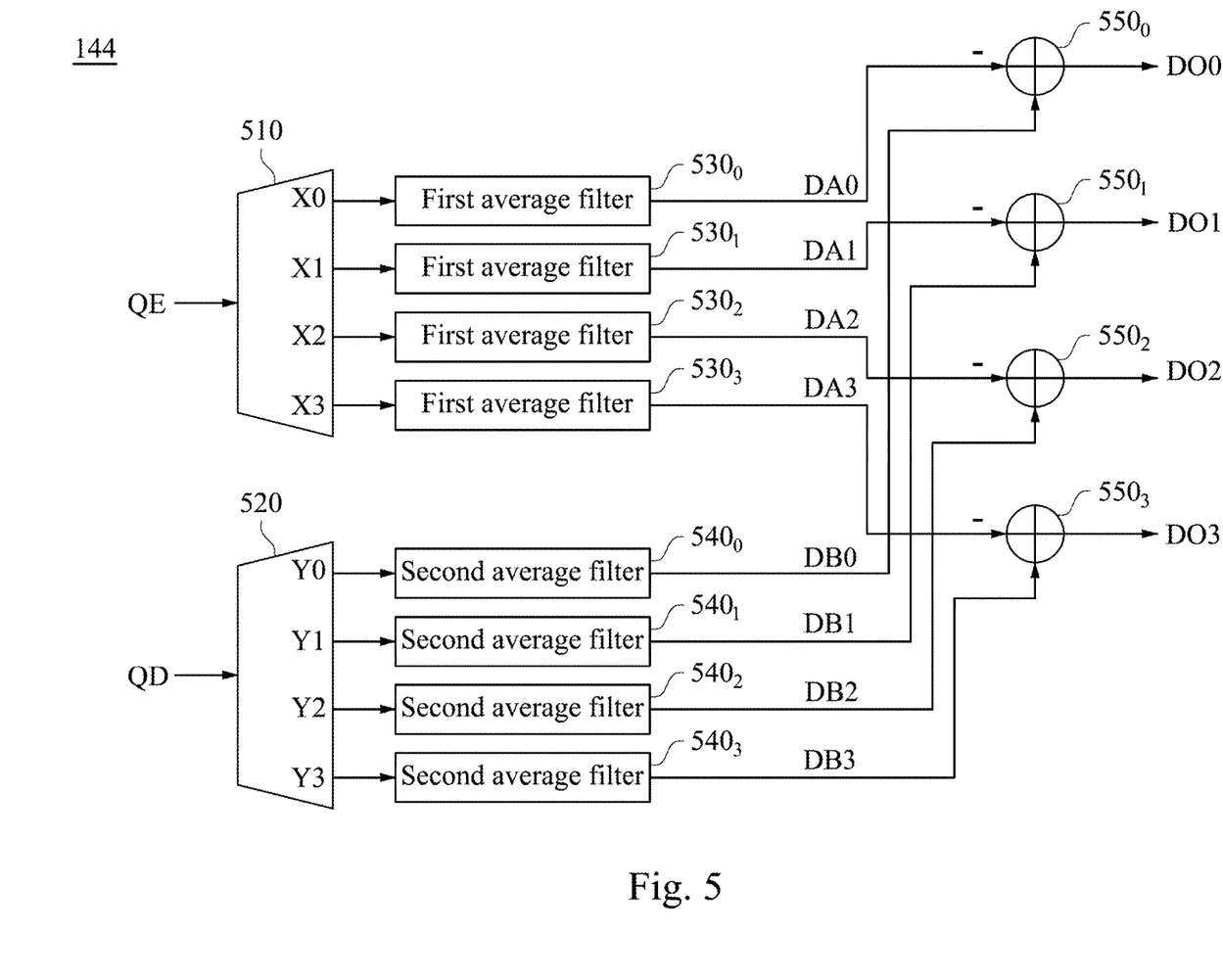
FIG. 5 is a simplified functional block diagram of a processing circuit according to an embodiment of the present disclosure.

Reference is made to FIG. 5, in which FIG. 5 is a simplified functional block diagram of the processing circuit 144 according to an embodiment of the present disclosure. The processing circuit 144 includes a first demultiplexer 510, a second demultiplexer 520, a plurality of first average filters $530_0$-$530_3$, a plurality of second average filters $530_0$-$530_3$, and a plurality of first computing circuits $550_0$-$550_3$.

The first demultiplexer 510 is configured to receive the fifth quantized output QE, and configured to distribute information in the fifth quantized output QE to a plurality of output terminals X0-X3 of the first demultiplexer 510 according to the sampling times. For example, the first demultiplexer 510 can use the output terminals X0-X3 to respectively output the third quantized output $QC_0$ of the sampling time TP1, the third quantized output $QC_1$ of the sampling time TP6, the third quantized output $QC_2$ of the sampling time TP11 and the third quantized output $QC_3$ of the sampling time TP16 in FIG. 4, and so forth.

The first average filters $530_0$-$530_3$ are respectively coupled with the output terminals X0-X3, and configured to respectively average the output signals of the output terminals X0-X3 to generate a plurality of first data DA0-DA3. The first average filters $530_0$-$530_3$ are configured to cancel information of crosstalk signals with other frequencies that are not mentioned above, from the output signals of the output terminals X0-X3.

The second demultiplexer 520 is configured to receive the fourth quantized output QD, and configured to distribute information in the fourth quantized output QE to a plurality of output terminals Y0-Y3 of the second demultiplexer 520, according to the sampling times. Reference is made to FIG. 3 and FIG. 5, for example, the second demultiplexer 520 can use the output terminals Y0-Y3 to respectively output the fourth quantized outputs QD of the sampling times TP1, TP6, TP11 and TP16, and so forth.

The second average filters $540_0$-$540_3$ are respectively coupled with the output terminals Y0-Y3, and are configured to respectively average output signals of the output terminals Y0-Y3 to generate a plurality of second data DB0-DB3. The second average filters $540_0$-$540_3$ are configured to cancel information of crosstalk signals with other frequencies that are not mentioned above, from the output signals of the output terminals Y0-Y3.

As can be appreciated from the above, the sampling times corresponding to the first data DA0-DA3 (e.g., the sampling times TP1, TP6, TP11 and TP16) are substantially identical to the sampling times corresponding to the second data DB0-DB3, respectively. In some embodiments, the first average filters $530_0$-$530_3$ and the second average filters $540_0$-$540_3$ may be realized by the moving average filters. In some embodiments, in the situation that the input signal SIN does not include those crosstalk signals with other frequencies, the first average filters $530_0$-$530_3$ and second average filters $540_0$-$540_3$ may be omitted, in which the output terminals X0-X3 of the first demultiplexer 510 may directly output the first data DA0-DA3, and the output terminals Y0-Y3 of the second demultiplexer 520 may directly output the second data DB0-DB3.

Accordingly, the information included by the first data DA0-DA3 corresponds to the crosstalk signal 320, and the information included by the second data DB0-DB3 corresponds to the target signal 310 and the crosstalk signal 320. The frequency of the target signal 310 is 500 MHz (or fs×i/N), and the frequency of the crosstalk signal 320 is 100 MHz (or fs×j/[N×(N+1)]).

The first computing circuits $550_0$-$550_3$ are configured to subtract the first data DA0-DA3 respectively from the second data DB0-DB3, so as to generate the output data DO0-DO3, respectively. Therefore, the information in the output data DO0-DO3 only corresponds to the target signal 310.

Figure 6:
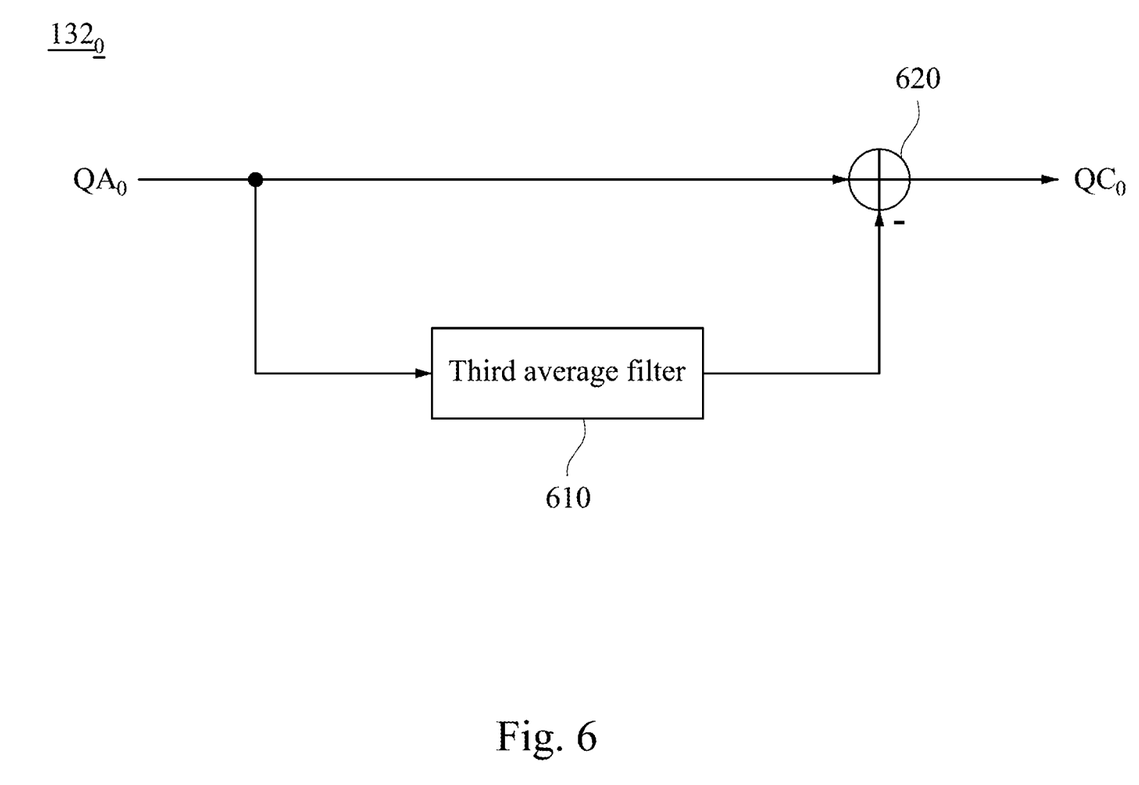
FIG. 6 is a simplified functional block diagram of a first sub-calibration circuit according to an embodiment of the present disclosure.

FIG. 6 is a simplified functional block diagram of the first sub-calibration circuit $132_0$ according to an embodiment of the present disclosure. The first sub-calibration circuit $132_0$ includes a third average filter 610 and a second computing circuit 620. The third average filter 610 is configured to average the first quantized output $QA_0$. The second computing circuit 620 is configured to subtract an output of the third average filter 610 (i.e., the averaged first quantized output $QA_0$, or the offset calibration value of the first quantized output $QA_0$) from the first quantized output $QA_0$, to generate the third quantized output $QC_0$. In this embodiment, other first sub-calibration circuits $132_1$-$132_3$ and the second sub-calibration circuit 134 have components, connection relationships and operations similar to those of the first sub-calibration circuit $132_0$ of FIG. 6 described above, and therefore a detailed description is omitted here for the sake of brevity.

As can be appreciated from the above, in the process of offset calibration, the analog-to-digital converting device 100 can ensure the generation of the correct output signal SOUT, and will not loss the sampling result in the situation that the frequency of the input signal SIN equals to the first sampling frequency of the first ADCs $110_0$-$110_3$. It is worth mentioning that the analog-to-digital converting device 100 is also applicable to a situation that the frequency of the target signal 310 is not a positive integer multiple of the first sampling frequency. In this situation, the first calibration circuit 130 will not erroneously calibrate the first quantized outputs $QA_0$-$QA_3$, so that the fourth quantized output QD and the fifth quantized output QE substantially have random values and are cancelled by the first average filters $530_0$-$530_3$ and the second average filters $540_0$-$540_3$ of FIG. 5. Therefore, the first data DA0-DA3 and the second data DB0-DB3 all correspond to 0 V, so that the output data DO0-DO3 correspond to 0 V and does not affect the output signal SOUT, rendering the output circuit 150 is equivalent to use only the third quantized outputs $QC_0$-$QC_3$ to generate the correct output signal SOUT.

Figure 7:
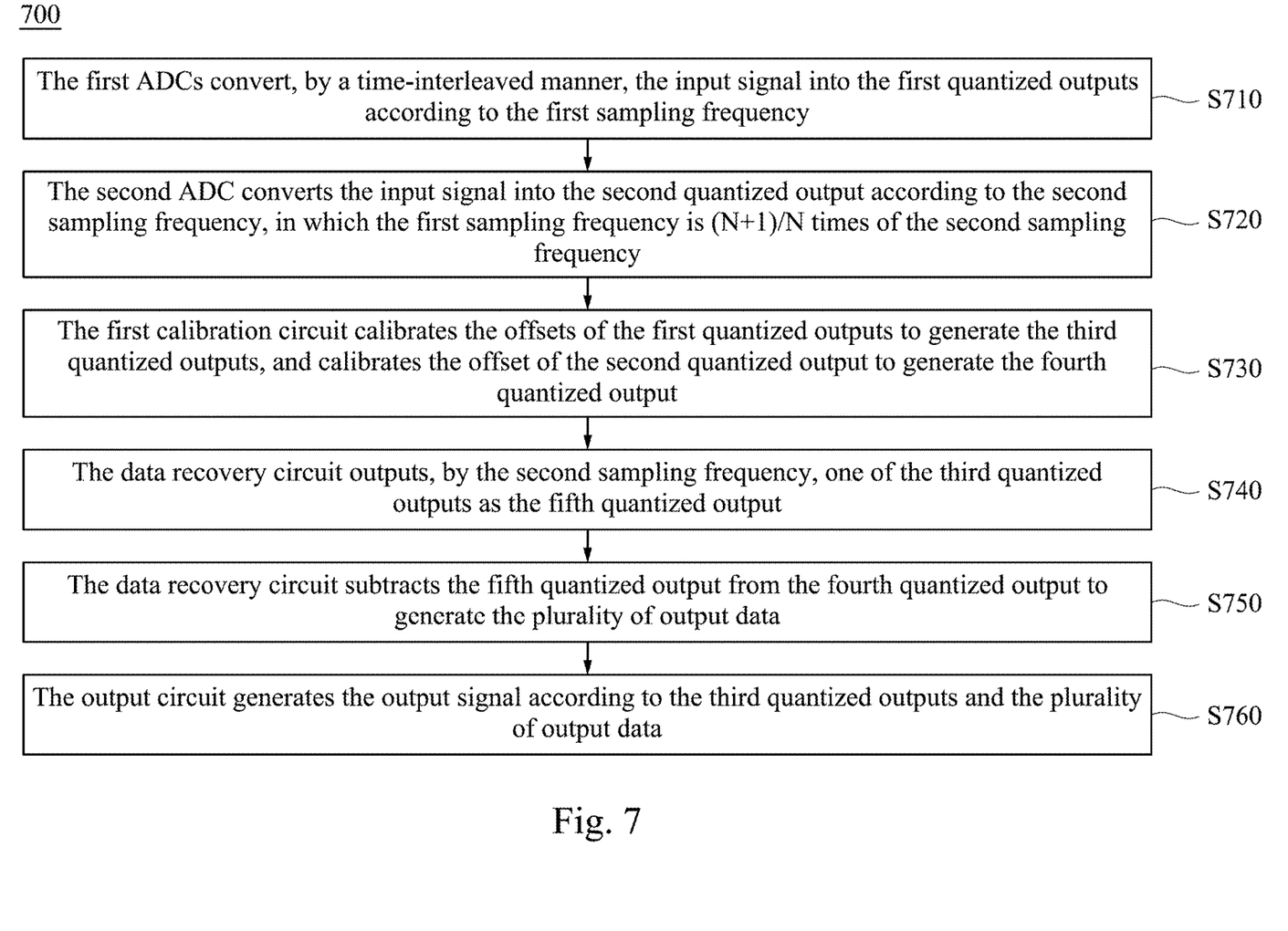
FIG. 7 is a flowchart of a method of offset calibration according to an embodiment of the present disclosure.

FIG. 7 is a flowchart of a method of offset calibration 700 according to an embodiment of the present disclosure. The analog-to-digital converting device 100 in each of the above embodiments can be used to conduct the method of offset calibration 700. It will be understood that any of the methods discussed herein may include greater or fewer operations than illustrated in the flowchart and the operations may be performed in any order, as appropriate.

In operation S710, the first ADCs $110_0$-$110_3$ convert, by a time-interleaved manner, the input signal SIN into the first quantized outputs $QA_0$-$QA_3$ according to the first sampling frequency.

In operation S720, the second ADC converts the input signal SIN into the second quantized output QB according to the second sampling frequency, in which the first sampling frequency is (N+1)/N times of the second sampling frequency.

In operation S730, the first calibration circuit 130 calibrates the offsets of the first quantized outputs $QA_0$-$QA_3$ to generate the third quantized outputs $QC_0$-$QC_3$, and calibrates the offset of the second quantized output QB to generate the fourth quantized output QD.

In operation S740, the data recovery circuit 140 outputs, by the second sampling frequency, one of the third quantized outputs $QC_0$-$QC_3$ as the fifth quantized output QE.

In operation S750, the data recovery circuit 140 subtracts the fifth quantized output QE from the fourth quantized output QD to generate the output data DO0-DO3.

In operation S760, the output circuit 150 generates the output signal SOUT according to the third quantized outputs $QC_0$-$QC_3$ and the output data DO0-DO3.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An analog-to-digital converting device, comprising:
    N-stage first analog-to-digital converters (ADCs) with a first sampling frequency, configured to convert, by a time-interleaved manner, an input signal into a plurality of stages of first quantized output, wherein N is a positive integer larger than or equal to 2;
    a second ADC with a second sampling frequency, configured to convert the input signal into a second quantized output, wherein the first sampling frequency is (N+1)/N times of the second sampling frequency;
    a first calibration circuit, configured to calibrate offsets of the plurality of stages of first quantized output and the second quantized output, so as to respectively generate a plurality of stages of third quantized output and a fourth quantized output;
    a data recovery circuit, coupled with the first calibration circuit, and configured to output, by the second sampling frequency, one of the plurality of stages of third quantized output as a fifth quantized output, and configured to subtract the fifth quantized output from the fourth quantized output to generate a plurality of output data; and
    an output circuit, configured to generate an output signal according to the plurality of stages of third quantized output and the plurality of output data.

2. The analog-to-digital converting device of claim 1, wherein during two successive samplings of the second ADC, the second ADC samples substantially simultaneously with a (K−1)-th stage first ADC of the N-stage first ADCs, and then samples substantially simultaneously with a K-th stage first ADC of the N-stage first ADCs, wherein K is a positive integer smaller than or equal to N.

3. The analog-to-digital converting device of claim 1, wherein the analog-to-digital converting device is operated as a time-interleaved analog-to-digital converting device with a system sampling period, wherein the data recovery circuit comprises:
    a selecting circuit, configured to receive the plurality of stages of third quantized output, and configured to output the one of the plurality of stages of third quantized output as the fifth quantized output every N system sampling periods,
    wherein a sampling time of a third quantized output currently outputted by the selecting circuit is spaced by (N+1) system sampling periods from a sampling time of a third quantized output previously outputted by the selecting circuit.

4. The analog-to-digital converting device of claim 3, wherein the data recovery circuit further comprises:
    a second calibration circuit, coupled with the selecting circuit, configured to calibrate an offset of the one of the plurality of stages of third quantized output, so as to generate the fifth quantized output.

5. The analog-to-digital converting device of claim 3, wherein the data recovery circuit further comprises:
    a second calibration circuit, coupled with the selecting circuit, configured to cancel components related to a crosstalk signal from the one of the plurality of stages of third quantized output, wherein a frequency of the crosstalk signal is substantially the same as the second sampling frequency.

6. The analog-to-digital converting device of claim 1, wherein the data recovery circuit comprises a processing circuit, and the processing circuit comprises:
    a first demultiplexer, configured to distribute the fifth quantized output as a plurality of first data;
    a second demultiplexer, configured to distribute the fourth quantized output as a plurality of second data; and a plurality of first computing circuits, configured to subtract the plurality of first data respectively from the plurality of second data to generate the plurality of output data.

7. The analog-to-digital converting device of claim 6, wherein a plurality of sampling times corresponding to the plurality of first data are substantially the same as a plurality of sampling times corresponding to the plurality of second data.

8. The analog-to-digital converting device of claim 6, wherein the processing circuit further comprises:
  a plurality of first average filters, configured to respectively average a plurality of outputs of the first demultiplexer to generate the plurality of first data; and
  a plurality of second average filters, configured to respectively average a plurality of outputs of the second demultiplexer to generate the plurality of second data.

9. The analog-to-digital converting device of claim 1, wherein the first calibration circuit comprises:
  a plurality of first sub-calibration circuits, respectively coupled with the N-stage first ADCs, wherein each first sub-calibration circuit comprises:
    a third average filter, configured to average a corresponding one of the plurality of stages of first quantized output; and
    a second computing circuit, configured to subtract an output of the third average filter from the corresponding one of the plurality of stages of first quantized output, so as to generate a corresponding one of the plurality of stages of third quantized output; and
  a second sub-calibration circuit, coupled with the second ADC, and comprising:
    a fourth average filter, configured to average the second quantized output; and
    a third computing circuit, configured to subtract an output of the fourth average filter from the second quantized output to generate the fourth quantized output.

10. A method of offset calibration, applicable to an analog-to-digital converting device, wherein the analog-to-digital converting device comprises N-stage first analog-to-digital converters (ADCs) and a second ADC, the method comprises:
  by a time-interleaved manner, utilizing the N-stage first ADCs to convert an input signal into a plurality of stages of first quantized output, according to a first sampling frequency, wherein N is a positive integer larger than or equal to 2;
  utilizing the second ADC to convert the input signal into a second quantized output, according to a second sampling frequency, wherein the first sampling frequency is (N+1)/N times of the second sampling frequency;
  calibrating offsets of the plurality of stages of first quantized output and the second quantized output, so as to respectively generate a plurality of stages of third quantized output and a fourth quantized output;
  outputting, by the second sampling frequency, one of the plurality of stages of third quantized output as a fifth quantized output;
  subtracting the fifth quantized output from the fourth quantized output to generate a plurality of output data; and
  generating an output signal according to the plurality of stages of third quantized output and the plurality of output data.

11. The method of offset calibration of claim 10, wherein during two successive samplings of the second ADC, the second ADC samples substantially simultaneously with a (K−1)-th stage first ADC of the N-stage first ADCs, and then samples substantially simultaneously with a K-th stage first ADC of the N-stage first ADCs, wherein K is a positive integer smaller than or equal to N.

12. The method of offset calibration of claim 10, wherein the analog-to-digital converting device is operated as a time-interleaved analog-to-digital converting device with a system sampling period, wherein outputting, by the second sampling frequency, the one of the plurality of stages of third quantized output as the fifth quantized output comprises:
  outputting the one of the plurality of stages of third quantized output as the fifth quantized output every N system sampling periods,
  wherein a sampling time of a third quantized output currently outputted is spaced by (N+1) system sampling periods from a sampling time of a third quantized output previously outputted.

13. The method of offset calibration of claim 12, wherein outputting the one of the plurality of stages of third quantized output as the fifth quantized output every N system sampling periods comprises:
  calibrating an offset of the one of the plurality of stages of third quantized output to generate the fifth quantized output.

14. The method of offset calibration of claim 12, wherein outputting the one of the plurality of stages of third quantized output as the fifth quantized output every N system sampling periods comprises:
  canceling components related to a crosstalk signal from the one of the plurality of stages of third quantized output, wherein a frequency of the crosstalk signal is substantially the same as the second sampling frequency.

15. The method of offset calibration of claim 10, wherein subtracting the fifth quantized output from the fourth quantized output to generate the plurality of output data comprises:
  distributing the fifth quantized output as a plurality of first data;
  distributing the fourth quantized output as a plurality of second data; and
  subtracting the plurality of first data from the plurality of second data, respectively, to generate the plurality of output data.

16. The method of offset calibration of claim 15, wherein a plurality of sampling times corresponding to the plurality of first data are substantially the same as a plurality of sampling times corresponding to the plurality of second data.

17. The method of offset calibration of claim 15, wherein the plurality of first data are formed by respectively averaging a plurality of signals formed by distributing the fifth quantized output, and the plurality of second data are formed by respectively averaging a plurality of signals formed by distributing the fourth quantized output.

18. The method of offset calibration of claim 10, wherein calibrating the offsets of the plurality of stages of first quantized output and the second quantized output comprises:
  respectively averaging the plurality of stages of first quantized output to generate a plurality of stages of averaged first quantized output;
  subtracting the plurality of stages of averaged first quantized output from the plurality of stages of first quantized output, respectively, so as to generate the plurality of stages of third quantized output;

averaging the second quantized output to generate an averaged second quantized output; and subtracting the averaged second quantized output from the second quantized output to generate the fourth quantized output.

\* \* \* \* \*